(12) United States Patent
Chen et al.

(10) Patent No.: US 11,916,105 B2
(45) Date of Patent: Feb. 27, 2024

(54) SEMICONDUCTOR DEVICE WITH CORNER ISOLATION PROTECTION AND METHODS OF FORMING THE SAME

(71) Applicant: Taiwan Semiconductor Manufacturing Co., Ltd., Hsinchu (TW)

(72) Inventors: Bwo-Ning Chen, Keelung (TW); Xusheng Wu, Hsinchu (TW); Pin-Ju Liang, Changhua County (TW); Chang-Miao Liu, Hsinchu (TW); Shih-Hao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 330 days.

(21) Appl. No.: 17/213,402

(22) Filed: Mar. 26, 2021

(65) Prior Publication Data
US 2022/0310783 A1 Sep. 29, 2022

(51) Int. Cl.
*H01L 29/06* (2006.01)
*H01L 29/423* (2006.01)
*H01L 29/786* (2006.01)
*H01L 29/66* (2006.01)
*H01L 21/02* (2006.01)

(52) U.S. Cl.
CPC .... *H01L 29/0653* (2013.01); *H01L 21/02603* (2013.01); *H01L 29/0673* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78618* (2013.01); *H01L 29/78696* (2013.01)

(58) Field of Classification Search
CPC ........... H01L 29/0653; H01L 21/02603; H01L 29/0673; H01L 29/42392; H01L 29/66545; H01L 29/66553; H01L 29/66636; H01L 29/66742; H01L 29/78618; H01L 29/78696
USPC .......................................................... 257/347
See application file for complete search history.

(56) References Cited

U.S. PATENT DOCUMENTS 9,818,872 B2  11/2017  Ching et al.
9,887,269 B2   2/2018  Ching et al.
9,899,398 B1   2/2018  Colinge et al.
(Continued)

*Primary Examiner* — Nduka E Ojeh
(74) *Attorney, Agent, or Firm* — HAYNES AND BOONE, LLP

(57) ABSTRACT

Semiconductor device and the manufacturing method thereof are disclosed. An exemplary semiconductor device comprises a semiconductor stack including semiconductor layers over a substrate, wherein the semiconductor layers are separated from each other and are stacked up along a direction substantially perpendicular to a top surface of the substrate; an isolation structure around a bottom portion of the semiconductor stack and separating active regions; a metal gate structure over a channel region of the semiconductor stack and wrapping each of the semiconductor layers; a gate spacer over a source/drain (S/D) region of the semiconductor stack and along sidewalls of a top portion of the metal gate structure; and an inner spacer over the S/D region of the semiconductor stack and along sidewalls of lower portions of the metal gate structure and wrapping edge portions of each of the semiconductor layers.

20 Claims, 14 Drawing Sheets

(56) References Cited

U.S. PATENT DOCUMENTS

| | | | |
|---|---|---|---|
| 10,032,627 B2 | 7/2018 | Lee et al. | |
| 10,109,721 B2 | 10/2018 | Lin et al. | |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 10,950,731 B1* | 3/2021 | Peng | H01L 29/785 |
| 2018/0175036 A1 | 6/2018 | Ching et al. | |
| 2019/0305106 A1* | 10/2019 | Bi | H01L 29/0649 |
| 2020/0035676 A1* | 1/2020 | Wang | H01L 29/785 |
| 2020/0083352 A1* | 3/2020 | Chanemougame | H01L 29/6681 |
| 2022/0254880 A1* | 8/2022 | Kim | H01L 29/42364 |
| 2022/0352334 A1* | 11/2022 | Yang | H01L 21/823412 |

* cited by examiner

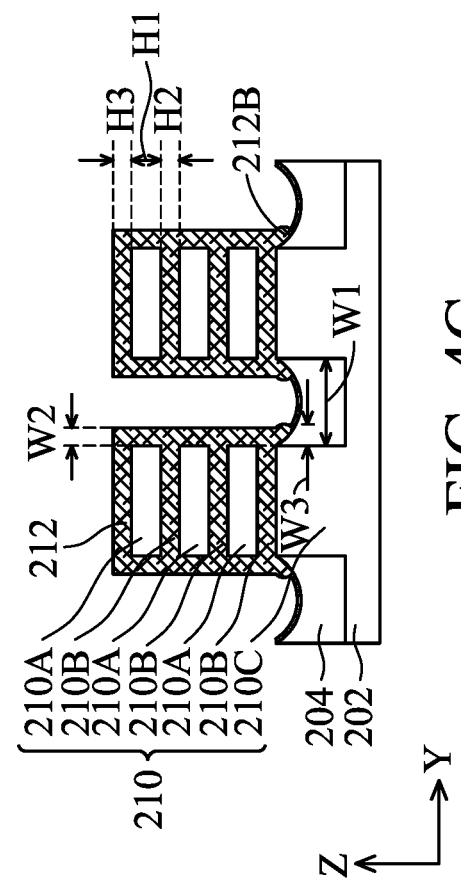
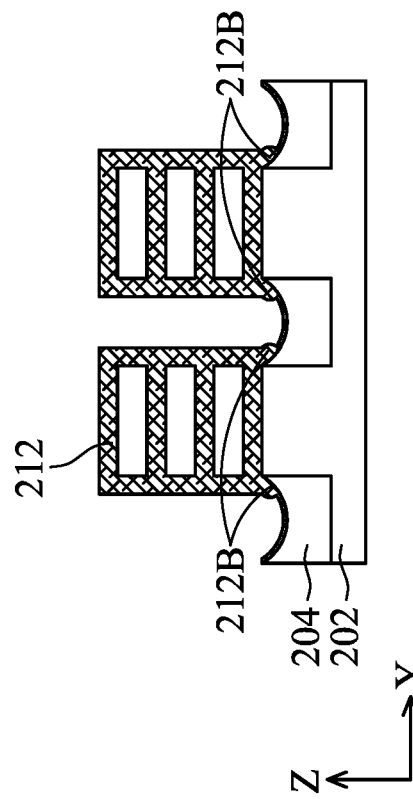
FIG. 4C
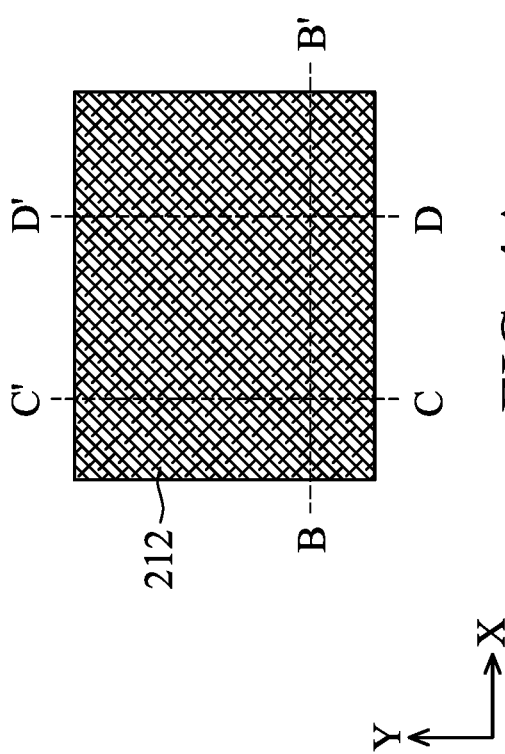
FIG. 4A
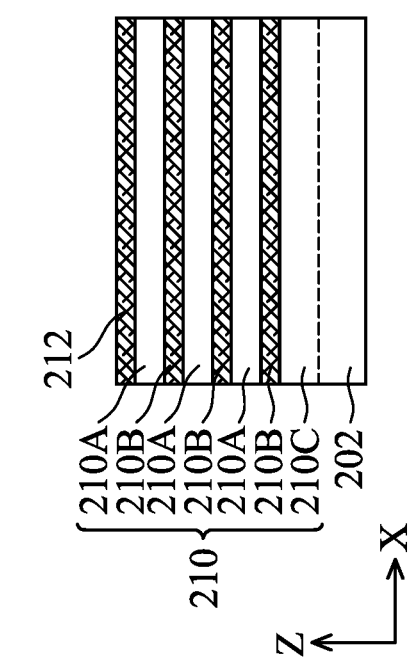
FIG. 4D
FIG. 4B

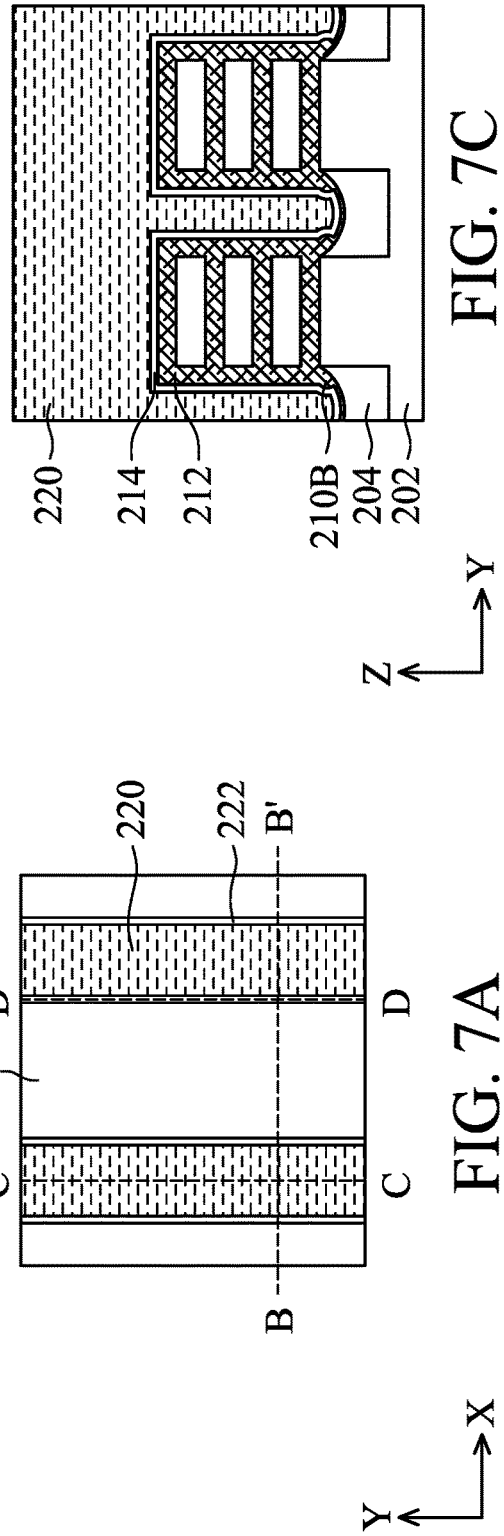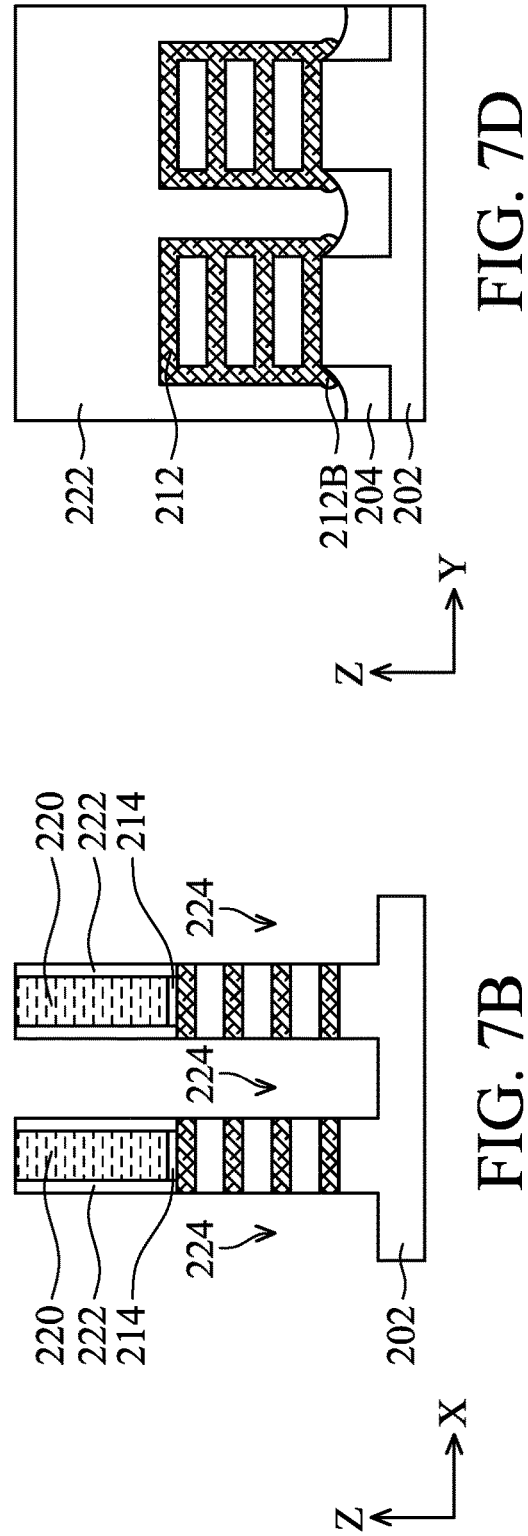

SEMICONDUCTOR DEVICE WITH CORNER ISOLATION PROTECTION AND METHODS OF FORMING THE SAME

BACKGROUND

The integrated circuit (IC) industry has experienced exponential growth. Multi-gate devices have been introduced to improve gate control by increasing gate-channel coupling and reducing off-state current. One such multi-gate device is a nanosheet device. A nanosheet device substantially refers to any device having a channel region including separated semiconductor channels, and a gate structure, or portions thereof, formed on more than one side of the semiconductor channels (for example, surrounding the semiconductor channels). In some instances, a nanosheet device is also called as a nanowire device, a nanoring device, a gate-surrounding device, a gate-all-around (GAA) device, or a multi-channel bridge device. Nanosheet transistors are compatible with conventional complementary metal-oxide-semiconductor (CMOS) fabrication processes and allow aggressive scaling down of transistors.

However, fabrication of nanosheet transistors presents challenges. For example, in a conventional nanosheet device, the isolation material between the bottom portion of the semiconductor stack and the metal gate is thin, which may cause high parasitic capacitance between the bottom portion of the metal gate and the semiconductor stack. Therefore, improvement is needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-13A illustrate top views of the semiconductor device in the three-dimensional perspective view at intermediate stages of the method of FIG. 1 in accordance with some embodiments of the present disclosure.

FIGS. 3B-13B illustrate cross-sectional views of the semiconductor device along line B-B' in the three-dimensional perspective view at intermediate stages of the method of FIG. 1 in accordance with some embodiments of the present disclosure.

FIGS. 3C-13C illustrate cross-sectional views of the semiconductor device along line C-C' in the three-dimensional perspective view at intermediate stages of the method of FIG. 1 in accordance with some embodiments of the present disclosure.

FIGS. 3D-13D illustrate cross-sectional views of the semiconductor device along line D-D' in the three-dimensional perspective view at intermediate stages of the method of FIG. 1 in accordance with some embodiments of the present disclosure.

DETAILED DESCRIPTION

Figure 1:
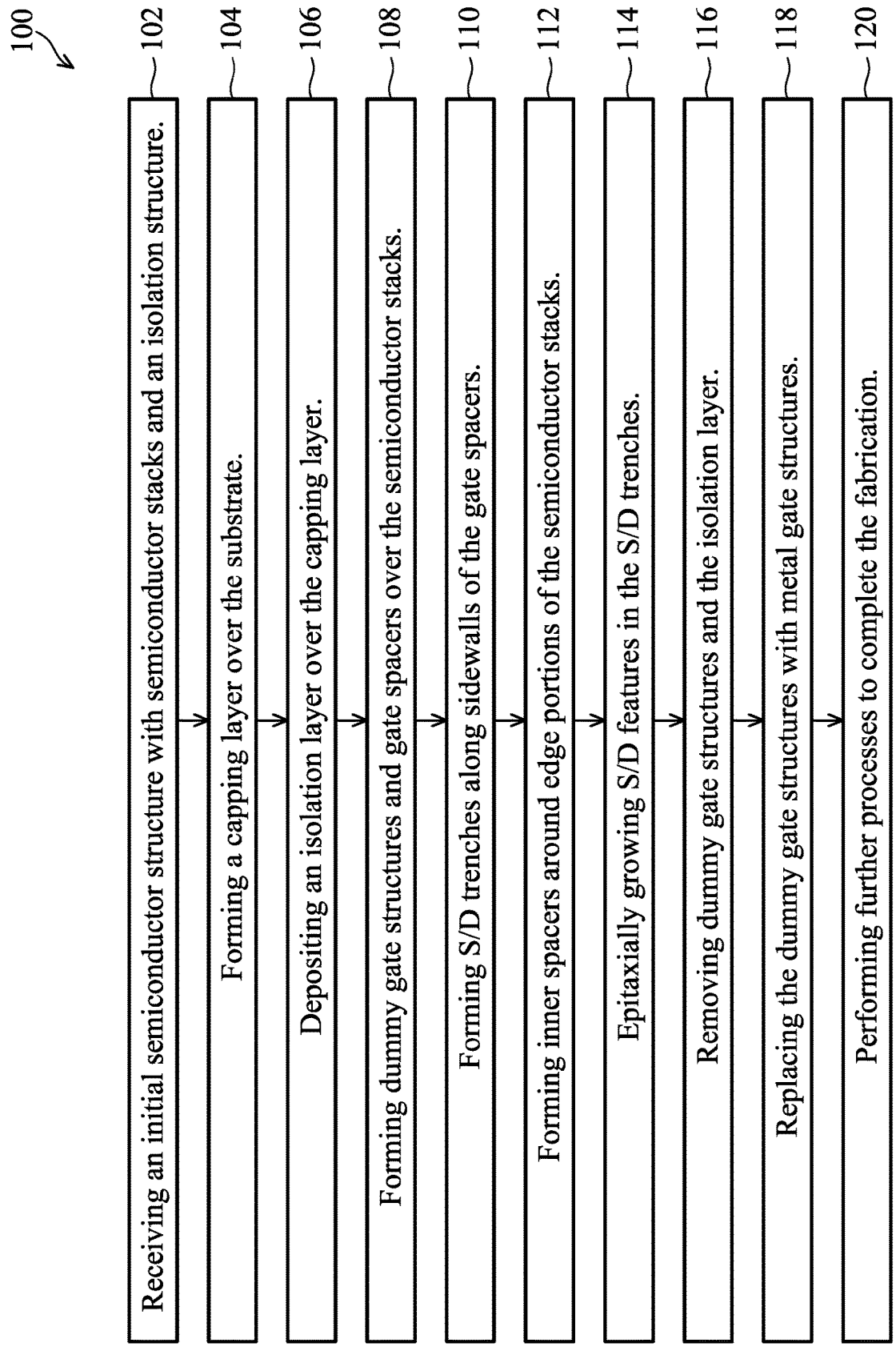
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as nanosheet FETs.

In a nanosheet device, a channel region of a single device may comprise multiple layers of semiconductor material physically separated from one another. In some examples, a gate of the device is disposed above, alongside, and even between the semiconductor layers of the device. In a conventional nanosheet device, the thickness of the silicon capping layer over the semiconductor stack (for example, to protect the semiconductor stack from being oxidized) is limited, because the silicon capping layer need to be fully oxidized such that it can be fully removed before the channel semiconductor layers are released. When removing the silicon capping layer, the isolation structure may also be partially removed. Therefore, the isolation material between the bottom portions of the semiconductor stack and the metal gate is thin, which may cause high parasitic capacitance between bottom portions of the metal gate and the semiconductor stack. In the present disclosure, a semiconductor capping layer including the same material as the sacrificial semiconductor layer (for example, including silicon germanium) is formed to protect the isolation structure when removing the dielectric isolation layer. Since the thickness of the semiconductor capping layer can be greater than the conventional silicon capping layer, the isolation material between the bottom portions of the semiconductor stack and the metal gate is thicker. Thus, the parasitic capacitance therebetween can be reduced. In addition, in the present disclosure, the inner spacer around the channel semiconductor layers has a more uniform profile, thus the gate to source/drain (S/D) capacitance and the overlap resistance is more uniform. Thereby, the performance of the semiconductor device is improved.

Figure 2:
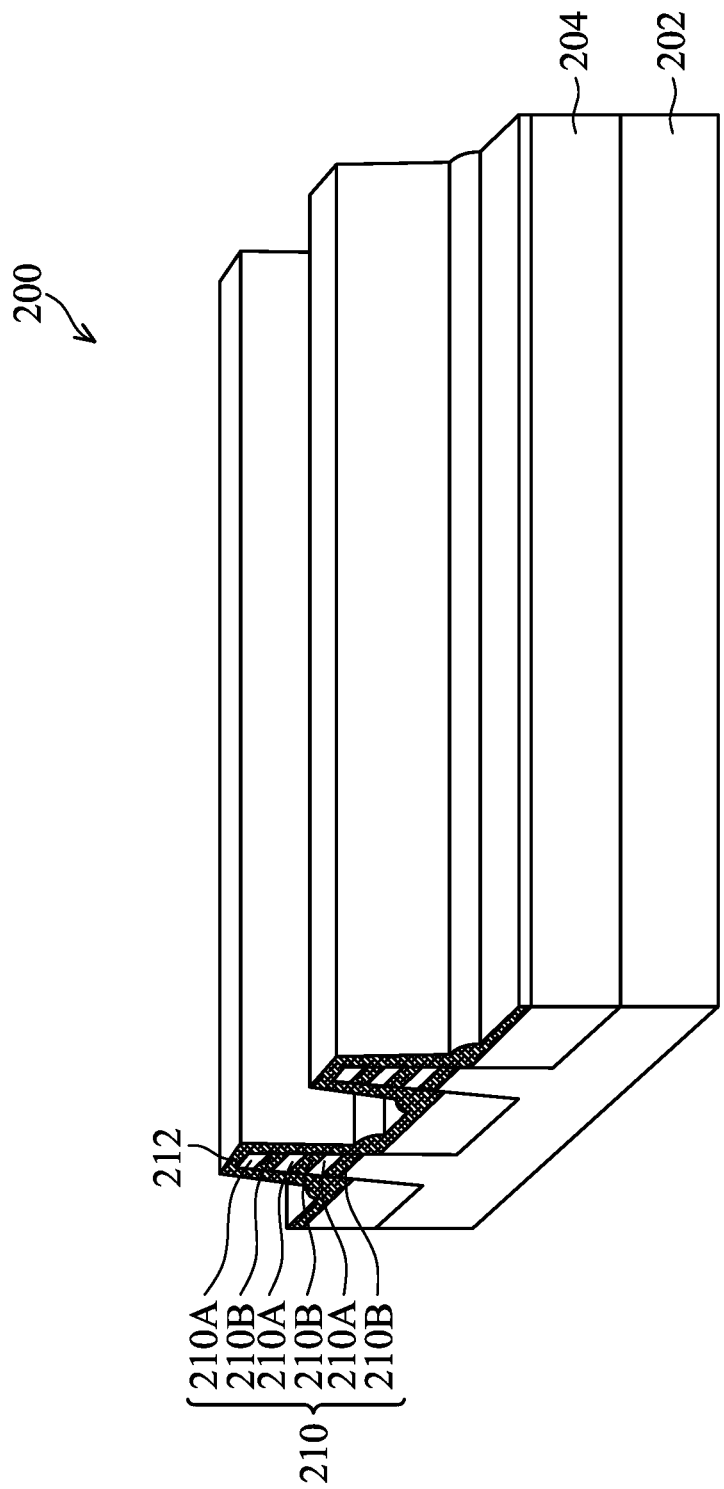
FIG. 2 illustrates a three-dimensional perspective view of the initial example semiconductor device accordance with some embodiments of the present disclosure.

FIG. 1 illustrates a flow chart of a method 100 for making an example semiconductor device 200 (hereinafter, device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of the device 200 during intermediate steps of method 100. In particular, FIG. 2 is a three-dimensional view of an initial structure of device 200 in accordance with some embodiments of the present disclosure. FIGS. 3A-13A illustrate top views of the device 200 shown in FIG. 2 (that is, in an X-Y plane) at intermediate stages of the method 100 in accordance with some embodiments of the present disclosure. FIGS. 3B-13B illustrate cross-sectional views of the device 200 taken along the plane B-B' shown in FIG. 2 (that is, in an X-Z plane) at intermediate stages of the method 100 in accordance with some embodiments of the present disclosure. FIGS. 3C-13C illustrate cross-sectional views of the device 200 taken along the plane C-C' shown in FIG. 2 (that is, in a first Y-Z plane) at intermediate stages of the method 100 in accordance with some embodiments of the present disclosure. FIGS. 3D-13D illustrate cross-sectional views of the device 200 taken along the plane D-D' shown in FIG. 2 (that is, in a second Y-Z plane) at intermediate stages of the method 100 in accordance with some embodiments of the present disclosure.

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations.

Referring to FIGS. 1, 2, and 3A-3D, at operation 102, an initial semiconductor structure of device 200 is formed. As depicted in FIGS. 2 and 3A-3D, device 200 comprises a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. For example, the substrate 202 may include PFET region comprising n-type doped substrate regions (such as n-well) and NFET region comprising p-type doped substrate regions (such as p-well).

The device 200 includes alternating semiconductor layers formed over the substrate 202, such as semiconductor layers 210A including a first semiconductor material and semiconductor layers 210B including a second semiconductor material that is different from the first semiconductor material. The different semiconductor materials of the semiconductor layers 210A and 210B have different oxidation rates and/or different etch selectivity. In some embodiments, the first semiconductor material of the semiconductor layers 210A is the same as the substrate 202. For example, the semiconductor layers 210A comprise silicon (Si, like the substrate 202), and the semiconductor layers 210B comprise silicon germanium (SiGe). Thus, alternating SiGe/Si/SiGe/Si/ . . . layers are arranged from bottom to top. In some embodiments, the material of the top semiconductor layer may or may not be the same as the bottom semiconductor layer. In some embodiments, no intentional doping is performed when forming the semiconductor layers 210A. In some other embodiments, the semiconductor layers 210A may be doped with a p-type dopant or an n-type dopant. The number of the semiconductor layers 210A and 210B depends on the design requirements of device 200. For example, it may comprise one to ten layers of semiconductor layers 210A or 210B each. In some embodiments, different semiconductor layers 210A and 210B have the same thickness in the Z-direction. In some other embodiments, different semiconductor layers 210A and 210B have different thicknesses. For example, each of the first semiconductor layers 210A has a thickness H1 in the Z-direction, each of the second semiconductor layers 210B has a thickness H2 in the Z-direction, and the thickness H2 is less than the thickness H1. In some embodiment, the thickness H1 is about 5 nm to about 20 nm and the thickness H2 is about 3 nm to about 15 nm. In some embodiments, the thickness H1 is about 100% to about 200% of the thickness H2. In some embodiments, the semiconductor layers 210A and/or 210B are formed by suitable epitaxy process. For example, semiconductor layers comprising SiGe and Si are formed alternately over the substrate 202 by a molecular beam epitaxy (MBE) process, a chemical vapor deposition (CVD) process, such as a metal organic CVD (MOCVD) process, and/or other suitable epitaxial growth processes.

Figure 3C:
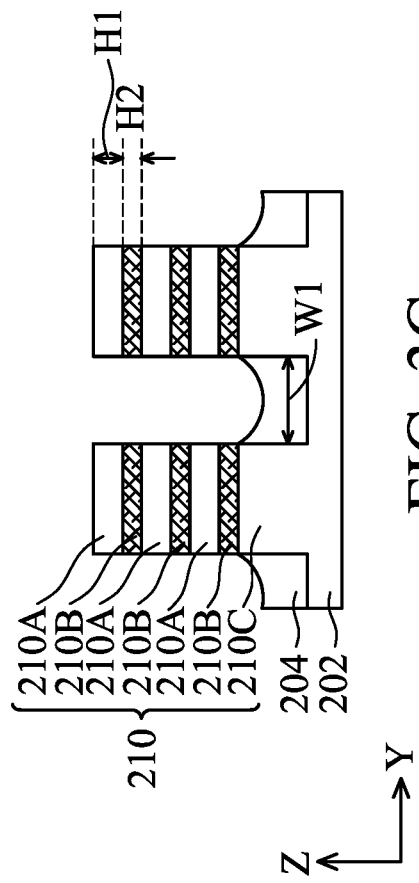

Thereafter, the alternating semiconductor layers 210A and 210B are patterned to form semiconductor stacks 210 (hereinafter the stacks 210). In some embodiments, various photoresist lithography and etching processes may be performed to the semiconductor layers 210A and 210B to form the stacks 210 in fin-shapes as illustrated. For example, first, a patterned photoresist mask is formed over the device 200. The patterned photoresist mask covers the fin positions according to the design requirement of device 200. Subsequently, one or more etching processes are performed using the patterned photoresist mask to remove the exposed portions of the first and second semiconductor layers 210A and 210B. The remained portions of the first and second semiconductor layers 210A and 210B form the fin-shape stacks 210. In some embodiments, a top portion of the substrate 202 is also patterned to form bottom portions 210C of the stacks 210. The etching process includes dry etching, wet etching, other suitable etching process, or combinations thereof. And, the photoresist mask is then removed using any proper method. As depicted in FIG. 3C, a distance between the bottom portions 210C of the stacks 210 is W1 (in the Y-direction).

Figure 3D:
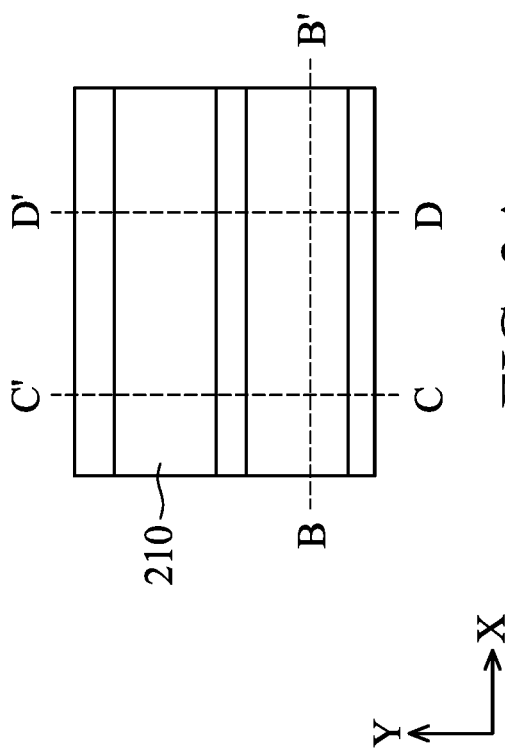
Figure 3A:
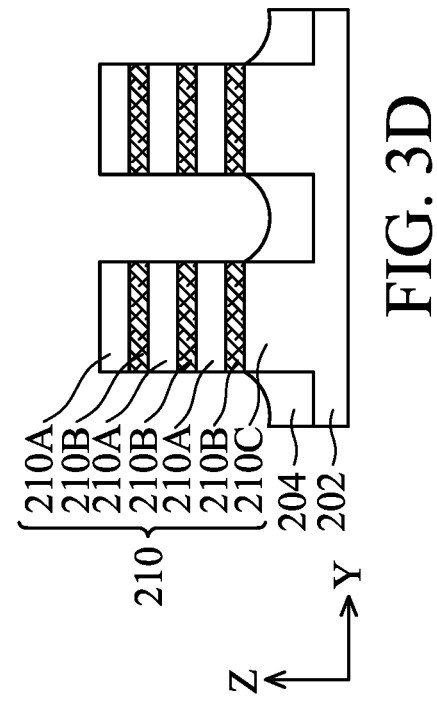
Figure 3B:
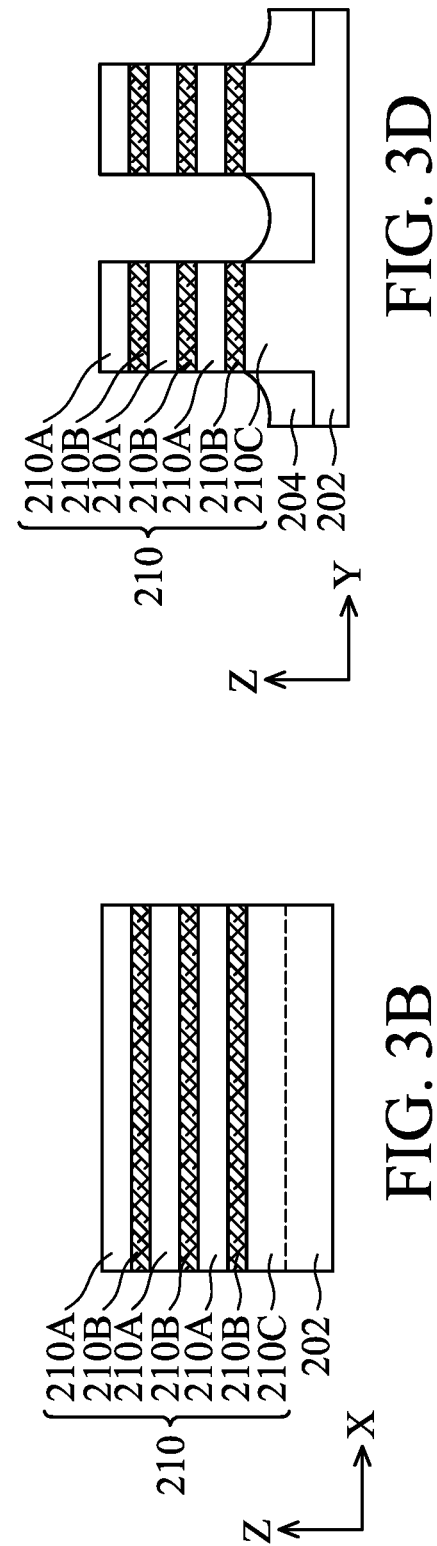
Figure 5A:
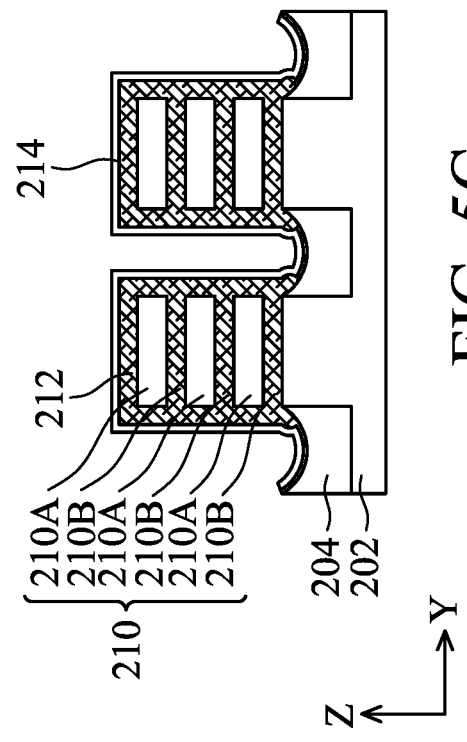
Figure 5C:
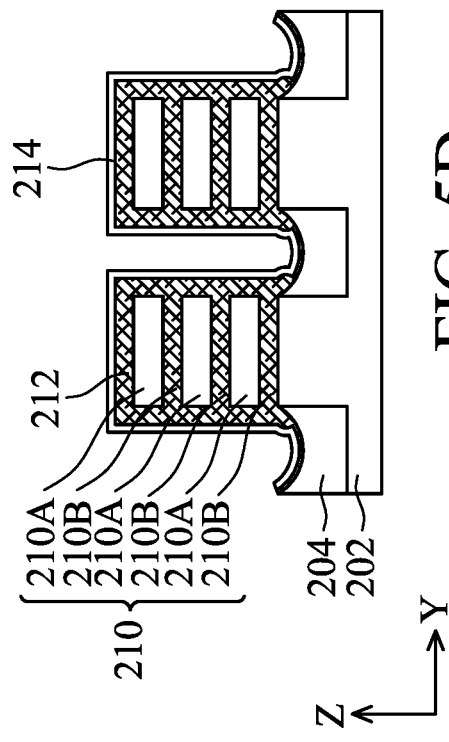
Figure 5B:
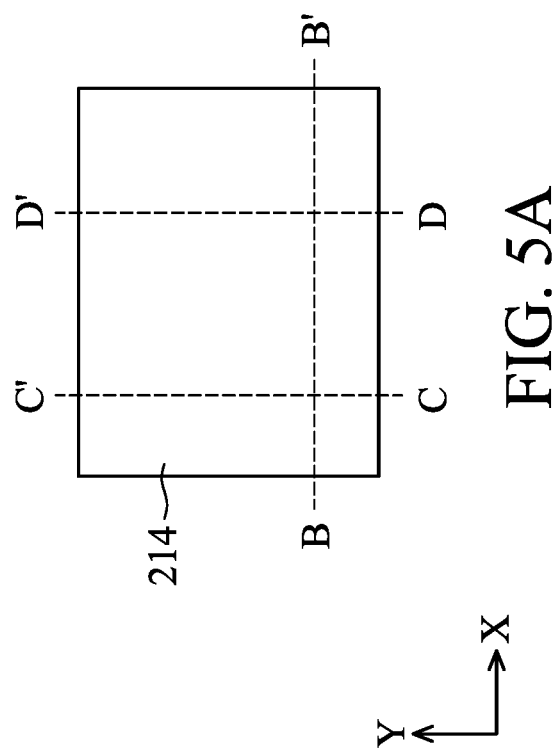
Figure 5D:
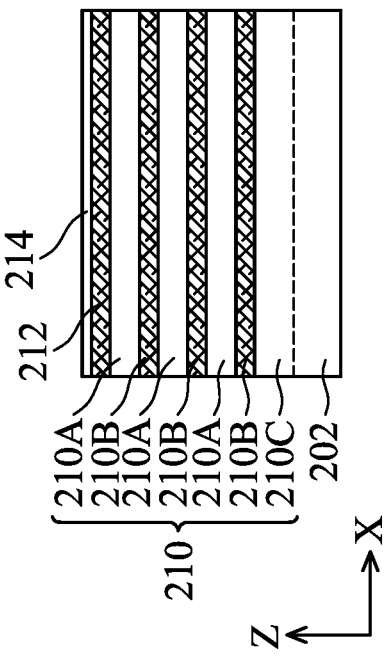

Thereafter, an isolation structure 204 is formed in the trenches between the stacks 210 to separate and isolate the active regions of device 200. The isolation structure 204 can be configured as different structures, such as a shallow trench isolation (STI) structure, a deep trench isolation (DTI) structure, a local oxidation of silicon (LOCOS) structure, or combinations thereof. The isolation structure 204 includes an isolation material, such as silicon oxide (SiO), silicon nitride (SiN), silicon oxynitride (SiON), other suitable dielectric material (for example, including silicon, oxygen, nitrogen, carbon, and/or other suitable isolation constituent), or combinations thereof. In some embodiments, one or more isolation materials, is deposited over the substrate 202 along sidewalls of the stacks 210. The dielectric material may be deposited by CVD (such as plasma enhanced CVD (PECVD)), physical vapor deposition (PVD), thermal oxidation, or other techniques. Subsequently, the dielectric material is recessed (for example, by etching and/or chemical mechanical polishing (CMP)) to form the isolation structure 204. In some embodiments, a top surface of the isolation structure 204 is substantially coplanar with or below a top surface of the bottom portion 210C of the stacks 210. In other words, the isolation structure 204 surrounds the bottom portions 210C of the stacks 210. And a width along the Y-direction of the isolation structure 204 between the adjacent stacks 210 is W1. Referring to FIGS. 3C and 3D, the isolation structure 204 has a continuous curved (recessed) top surface between the stacks 210.

Thereafter, referring to FIGS. 1 and 4A-4D, at operation 104, a capping layer 212 is formed over the substrate 202. Referring to FIGS. 4A-4D, the capping layer 212 is formed over the top surfaces and around sidewalls of the stacks 210. The capping layer 212 is also formed over the isolation structure 204. In some embodiments, the capping layer 212 includes a material same as the semiconductor layers 210B. Therefore, in a later process to release the channel semiconductor layers (i.e. semiconductor layers 210A), the capping layer 212 and the semiconductor layers 210B can be removed in the same process. In some embodiments, the semiconductor layers 210B includes SiGe, and the capping layer 212 includes SiGe as well. The capping layer 212 is formed by a deposition process, such as CVD (for example, PECVD), PVD, and/or other suitable deposition process. In some embodiments, after depositing the capping layer 212 (for example, using PECVD), a top surface of the capping layer 212 may be oxidized. For example, if the capping layer 212 includes SiGe, the top surface of the capping layer 212 may include SiGeO.

Due to the different materials of the stacks 210 (i.e. semiconductor material) and the isolation structure 204 (i.e. dielectric material), the capping layer 212 has different formation speeds around the stacks 210 and over the isolation structure 204. Referring to FIGS. 4C and 4D, the formation speed of the capping layer 212 around the stacks 210 is faster than that over the isolation structure 204. Therefore, a bump 212B is formed at a corner interfacing the stacks 210 and the isolation structure 204. Referring to FIGS. 4C, the capping layer 212 has a thickness H3 in the Z-direction over the stacks 210. In some embodiments, the thickness H3 is about 50% to about 200% of the thickness H2 of the semiconductor layers 210B. In some further embodiments, the thickness H3 is about 3 nm to about 10 nm. If the thickness H3 is more than 200% of the H2 or if the thickness H3 is more than 10 nm, the capping layer 212 may merged between the stacks 210, thus left no space for the gate structures and spacers to be formed between the stacks. On the other hand, if the thickness H3 is less than 50% of the H2 or if the thickness H3 is less than 3 nm, the bump 212B may not be big enough to protect the corner isolation material during the dummy gate structure and isolation layer 214 (FIGS. 5A-5D) removing process, the parasitic capacitance may be increased in some instances. The capping layer 212 has a thickness W2 in the Y-direction along the sidewalls of the stacks 210. In some embodiments, the thickness W2 is 10%~30% of the distance W1 between the stacks 210. The bump 212B of the capping layer 212 has a thickness W3 in the Y-direction. In some embodiments, the thickness W3 is about 120% to about 200% of the thickness W2. In some further embodiments, the thickness W3 is about 2 nm to about 15 nm. Similarly, the thickness W3 of the bump 212B cannot be too big or too small. If W3 is too big, the adjacent stacks 210 may be connected, thus left no space for the gate structure and gate spacers to be formed therebetween; or, if W3 is too small, it cannot efficiently protect the corner isolation material and the parasitic capacitance may be increased.

Referring to FIGS. 1 and 5A-5D, at operation 106, an isolation layer 214 is formed on the capping layer 212, i.e. over the top surfaces and around sidewalls of the stacks 210, and over the isolation structure 204. In some embodiments, the isolation layer 214 is formed to protect the stacks 210 from being oxidized. In some embodiments, the isolation layer 214 includes a dielectric material such as SiO, SiN, SiON, other suitable dielectric material, or combinations thereof. The dielectric isolation layer 214 is formed by a deposition process, such as atomic layer deposition (ALD), CVD, PVD, and/or other suitable deposition process.

Figure 6C:
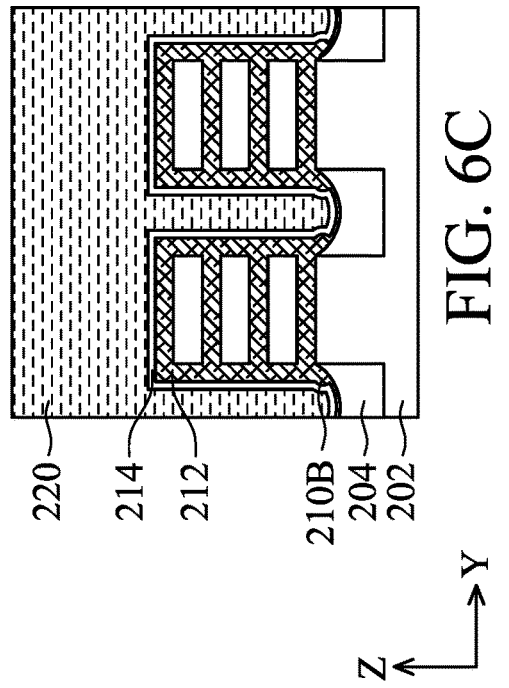

Referring to FIGS. 1 and 6A-6D, at operation 108, dummy gate structures 220 are formed over the stacks 210. Each dummy gate structure 220 serves as a placeholder for subsequently forming a metal gate structure. In some embodiments, the dummy gate structures 220 extend along the Y-direction and traverse respective stacks 210. The dummy gate structures 220 cover the channel regions of the stacks 210 which interpose the source regions and the drain regions (both referred to as the S/D regions). Each of the dummy gate structures 220 may include various dummy layers, for example, an interfacial layer (including a dielectric material such as SiN, SiO, SiON, etc.), a dummy gate electrode (including polysilicon), one or more hard mask layers (including a dielectric material such as SiN, silicon carbonitride (SiCN), SiO, etc.), and/or other suitable layers. The dummy gate structures 220 are formed by deposition processes, lithography processes, etching processes, other suitable processes, or combinations thereof. For example, first, different dummy gate layers are deposited over the stacks 210. A lithography process is then performed to form a mask covering the channel regions of the stacks 210. Thereafter, the different dummy gate layers are etched using the lithography mask to form the dummy gate structures 220. In some embodiments, referring to FIG. 6B, portions of the isolation layer 214 uncovered by the lithography mask are also removed by the etching process. The etching process may be a dry etch, a wet etch, or combinations thereof. Referring to FIG. 6C, the isolation layer 214 covered by the dummy gate structures 220 is remained. And, the lithography mask is then removed using any proper method.

Figure 6D:
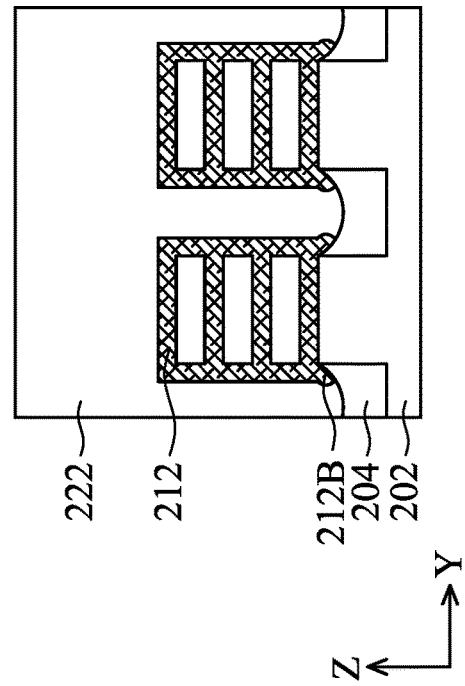
Figure 6A:
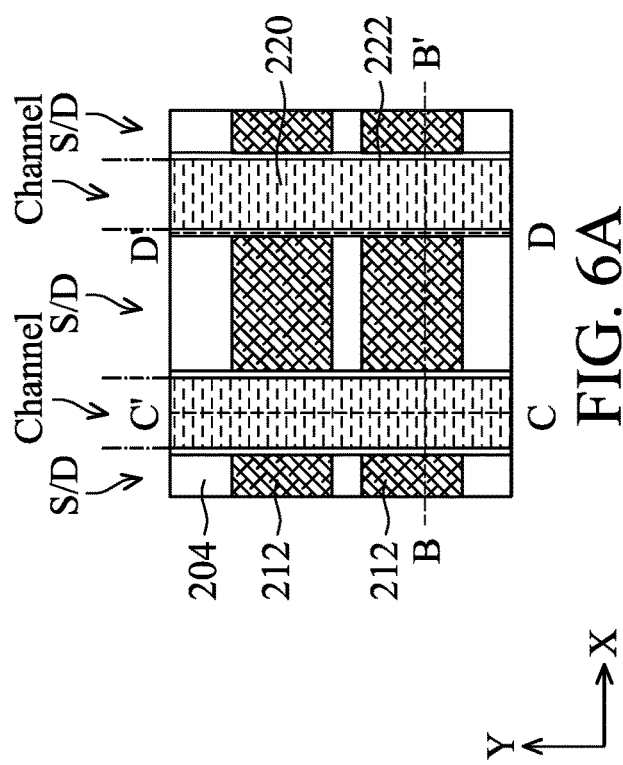
Figure 6B:
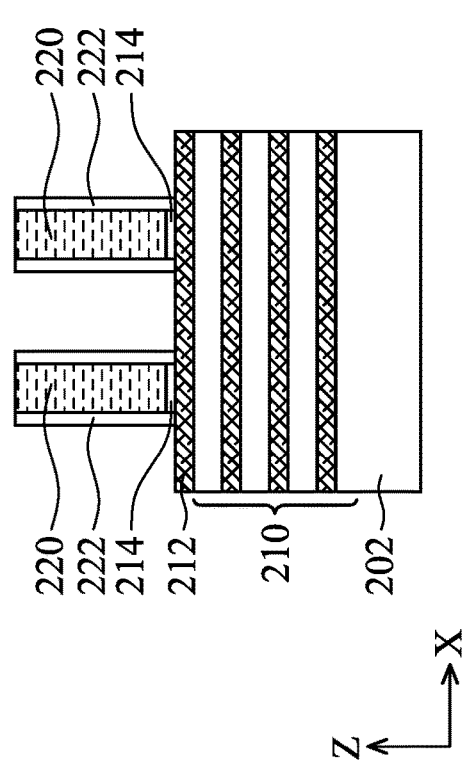

Still referring to FIGS. 1 and 6A-6D, at operation 108, gate spacers 222 are formed along sidewalls of the dummy gate structures 220 in the S/D regions of the stacks 210. In some embodiments, the gate spacers 222 comprises a dielectric material, such as SiO, SiN, SiON, silicon carbide (SiC), other dielectric material, or a combination thereof. In some embodiments, the gate spacers 222 are single layer structures. In some other embodiments, the gate spacers 222 includes multiple layers. The gate spacers 222 are formed by various deposition and etching processes. For example, the dielectric material of the gate spacers 222 are deposited over the substrate 202 by a deposition process (for example, by ALD, CVD, PVD, or other proper process) to form a gate spacer layer. The gate spacer layer is formed over the isolation structure 204, along sidewalls and over top surfaces of the dummy gate structures 220, and along sidewalls and over top surfaces of the stacks 210. Thereafter, an anisotropically etching process is performed to remove the portions of the spacer layer in the X-Y plane (the plane in which the top surface of the substrate 202 is). The remaining portions of the spacer layer along sidewalls of the dummy gate structures 220 and around the stacks 210 become the gate spacers 222. The anisotropically etching includes wet etching, dry etching, or combinations thereof. As depicted in FIG. 6D, the gate spacers 222 covers and surrounds the isolation layer 212 in the S/D region.

Referring to FIGS. 1 and 7A-7D, at operation 110, S/D trenches 224 are formed in the S/D regions of the stacks 210. In some embodiments, the stacks 210 are recessed by a S/D etching process along sidewalls of the gate spacers 222 to form the S/D trenches 224. The S/D etching process may be a dry etching process (such as a reactive ion etching (RIE) process), a wet etching process, or combinations thereof. The duration of the S/D etching process is controlled such that the sidewalls of each semiconductor layers 210A and 210B, as well as the bottom portion 210C, are exposed in the S/D trenches 224.

Now referring to FIGS. 1, 8A-8D, at operation 112, inner spacers 230 are formed around the edge portions of the semiconductor layers 210A. In some embodiments, first, the portions (edges) of the semiconductor layers 210B and the isolation layer 212 exposed in the S/D trenches 224 are selectively removed by a suitable etching process to form gaps between the edge portions of the semiconductor layers 210A. In other words, the edge portions of the semiconductor layers 210A are suspended in the S/D trenches 224. Due to the different oxidation rates and/or etching selectivities of the materials of the semiconductor layers 210A (for example, Si) and the semiconductor layers 210B or the capping layer 212 (for example, SiGe), only exposed portions (edges) of the semiconductor layers 210B and the capping layer 212 are removed, while the semiconductor layers 210A remain substantially unchanged. In some embodiments, the selective removal of the exposed portions of the semiconductor layers 210B may include an oxidation process followed by a selective etching process. For example, the edge portions of the semiconductor layers 210B and the capping layer 212 are first selectively oxidized to include a material of SiGeO. Then, a selective etching process is performed to remove the SiGeO with a suitable etchant such as ammonium hydroxide (NH4OH) or hydro fluoride (HF). The duration of the oxidation process and the selective etching process can be controlled such that only edge portions of the semiconductor layers 210B and the capping layer 212 are selectively removed.

Thereafter, inner spacers 230 are formed surrounding the edge portions of the semiconductor layers 210A. The inner spacers 230 comprise a dielectric material which can be same as or different from the material of the gate spacers 222. In some embodiments, the inner spacers 230 comprise a dielectric material such as SiO, SiN, SiON, SiC, or combinations thereof. The dielectric material of the inner spacers may be deposited in the S/D trenches 224 and fill in the gaps around the edge portions of the semiconductor layers 210A by CVD, PVD, ALD, or combinations thereof. Extra dielectric material is then removed along sidewalls of the gate spacers 222 until the sidewalls of the semiconductor layers 210A are exposed in the S/D trenches 224.

In a conventional nanosheet device where no SiGe capping layer formed around the semiconductor stacks, the inner spacers only fill in the gaps between the edge portions of the channel semiconductor layers (for example, the semiconductor layers 210A). However, in the present disclosure, due to the SiGe capping layer, the inner spacers 230 not only include the portions 230A fill in the gaps between the edge portions of the channel semiconductor layers (i.e. semiconductor layers 210A), but also a portion 230T above the topmost channel semiconductor layer, and side portions 230S along sidewalls of the channel semiconductor layers. The inner spacers also include bump portions 230B at the corner between the isolation structure 204 and the semiconductor stacks 210. Therefore, the inner spacer has a more uniform shape around the channel semiconductor layers than the conventional nanosheet device, which may result in a more uniform gate to S/D capacitance and a more uniform overlay resistance.

Figure 8A:
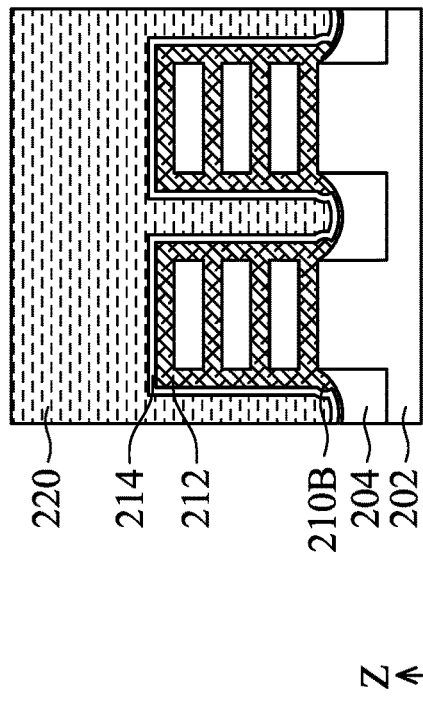
Figure 8B:
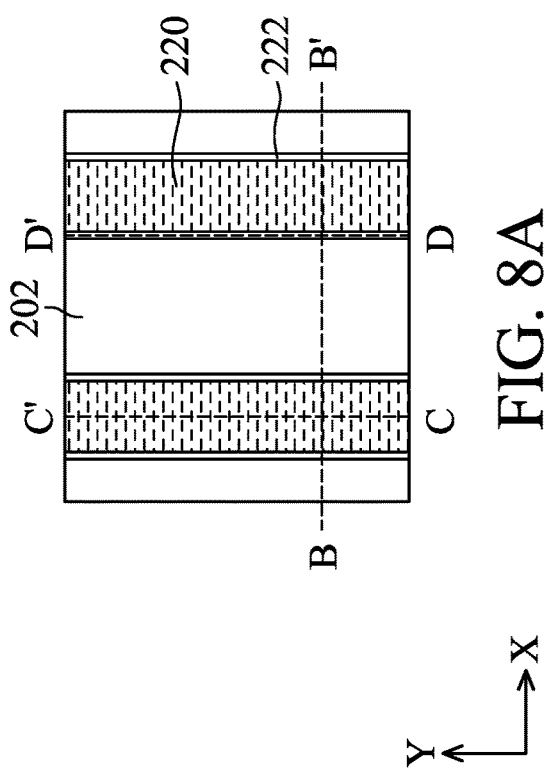
Figure 8C:
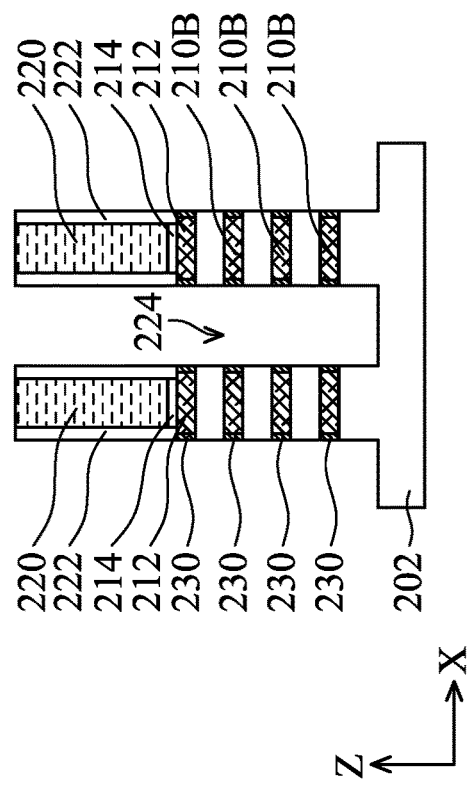
Figure 8D:
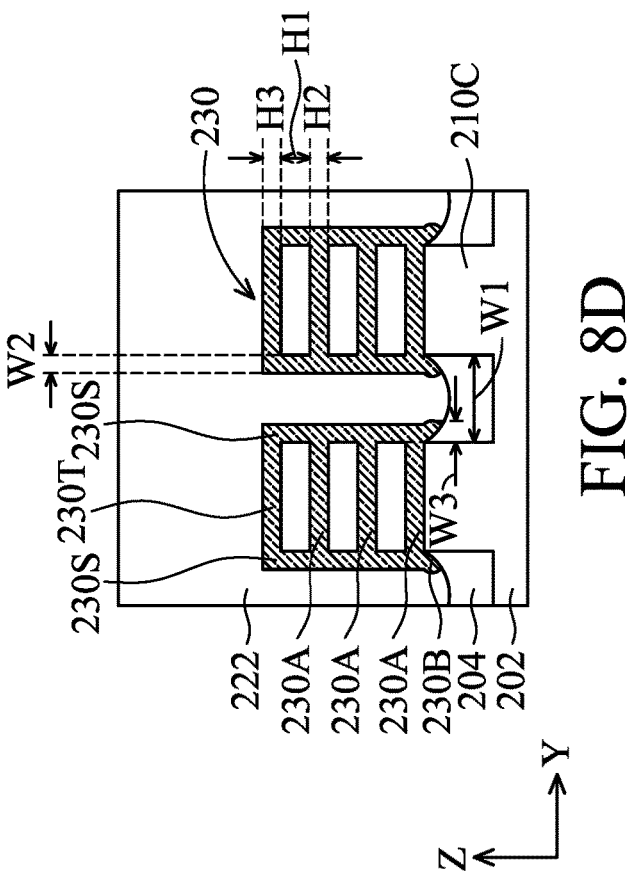

Referring to FIG. 8D, the horizontal portions 230A of the inner spacer has a thickness H2, and the horizontal portion 230T of the inner spacer has a thickness H3, which is about 50% to about 200% of the thickness H2. The vertical side portions 230S has a width W2 which is less than about 10% of the width W1 of the isolation structure 204 between the stacks 210. The bump portion 230B has a width W3, which is about 120% to about 200% of W2. The various sizes of the inner spacer 230 are comply with the sizes of the capping layer 212.

Figure 9A:
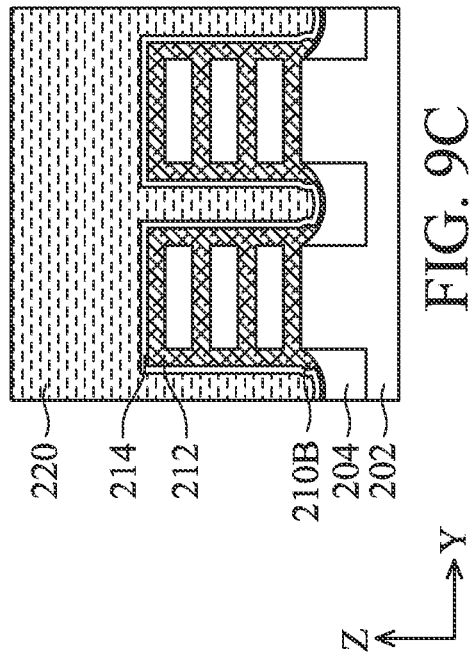
Figure 9C:
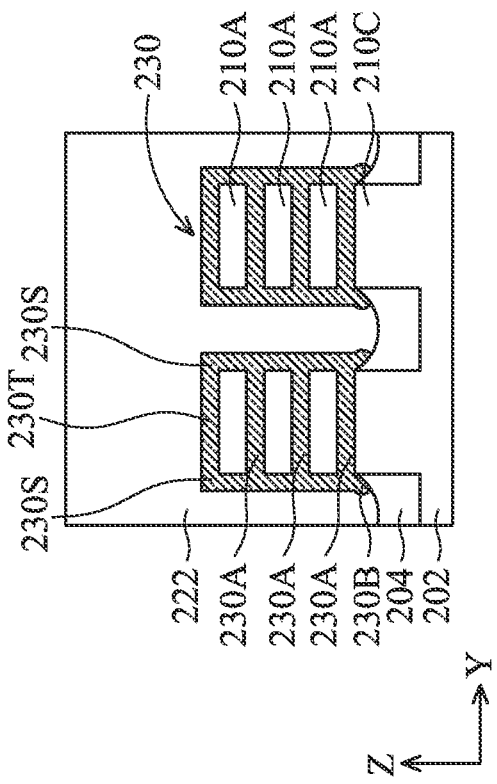
Figure 9B:
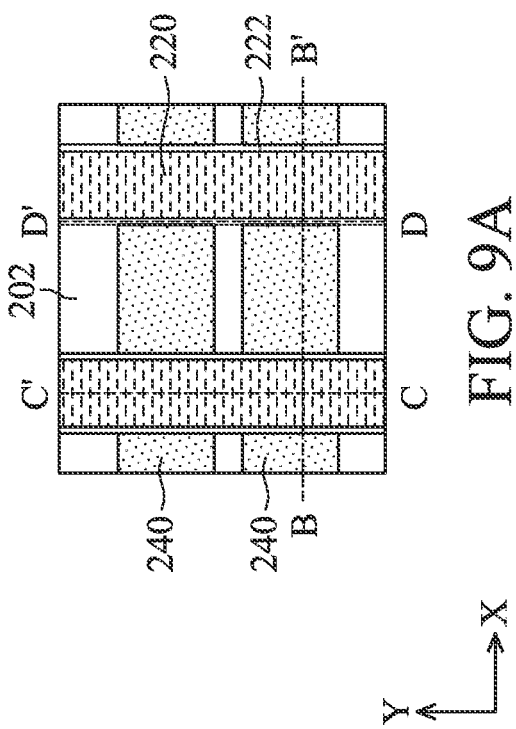
Figure 9D:
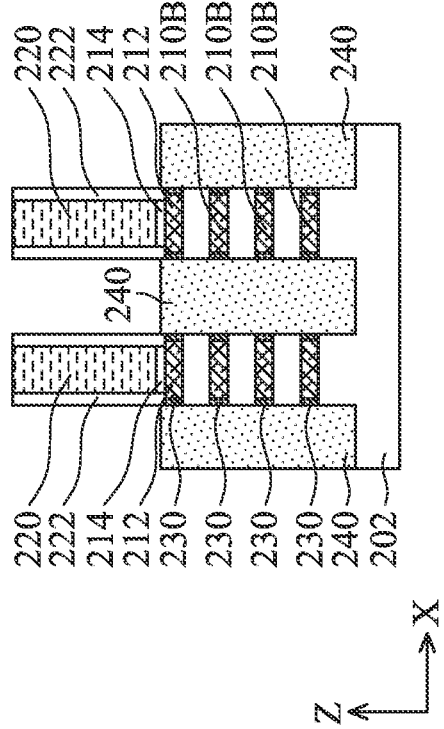

Now referring to FIGS. 1 and 9A-9D, at operation 114, the S/D features 240 are epitaxially grown in the S/D trenches 224. In some embodiments, the epitaxial S/D features 240 include a semiconductor material such as Si or Ge; a compound semiconductor such as SiGe, SiC, gallium arsenide (GaAs), etc.; an alloy semiconductor; or combinations thereof. An epitaxy process may be implemented to epitaxially grow the S/D features 240. The epitaxy process may comprise CVD deposition (for example, vapor-phase epitaxy (VPE), ultra-high vacuum CVD (UHV-CVD), low-pressure CVD (LPCVD), and/or plasma-enhanced (PECVD)), molecular beam epitaxy (MBE), other suitable selective epitaxial growth (SEG) processes, or combinations thereof. In some embodiments, the epitaxial S/D features 240 are separated for different stacks 210 and are not merged in the Y-direction, as depicted in FIG. 9A. In some other embodiments, the epitaxial S/D features 240 may be merged in the Y-direction and crossing more than one stacks 210.

Figure 10A:
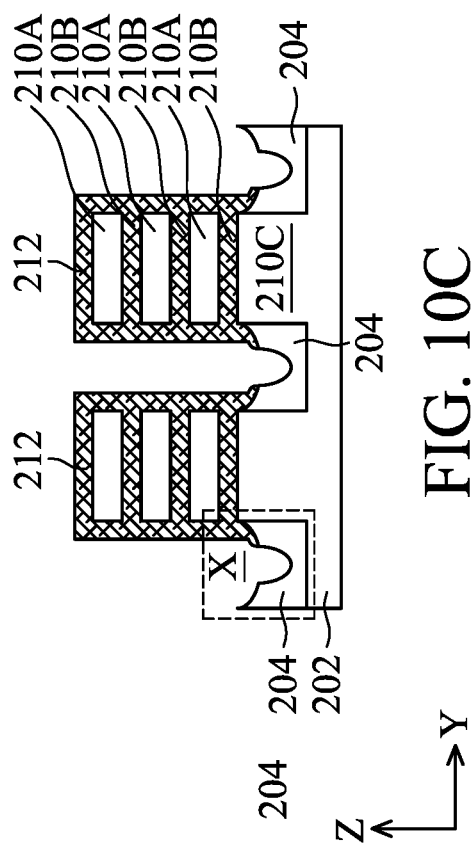
Figure 10B:
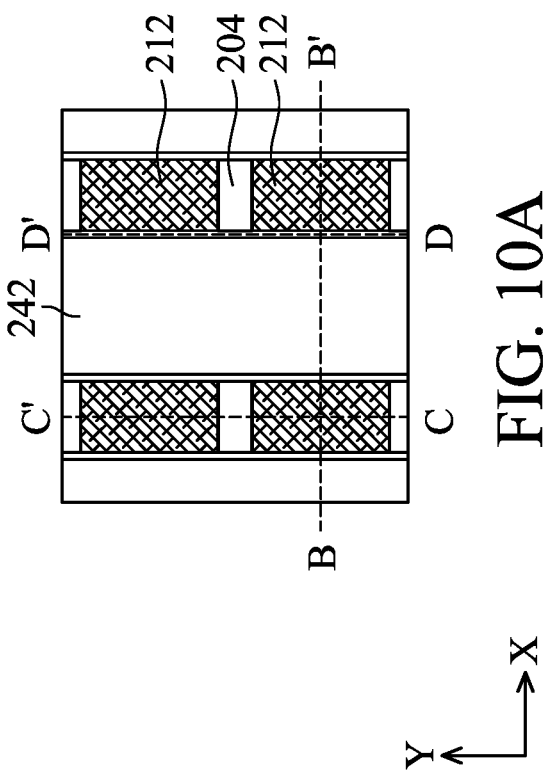
Figure 10C:
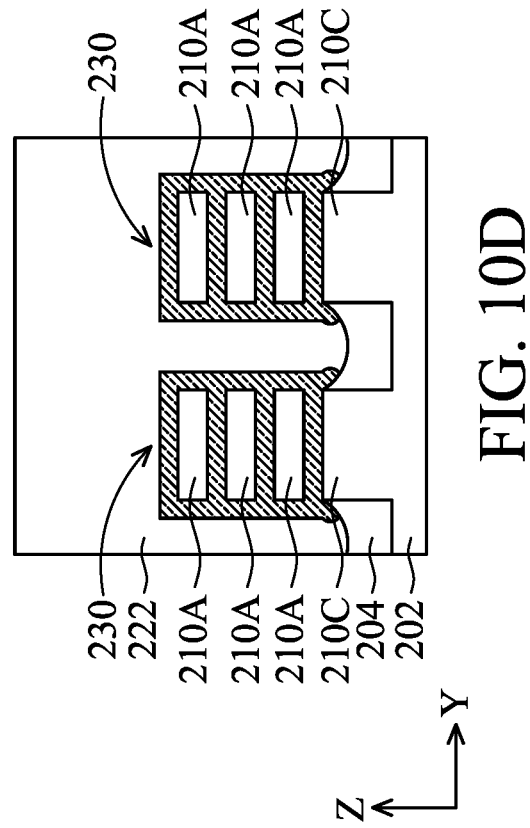
Figure 10D:
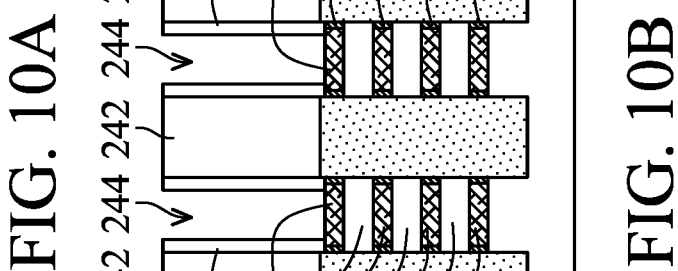
Figure 10E:
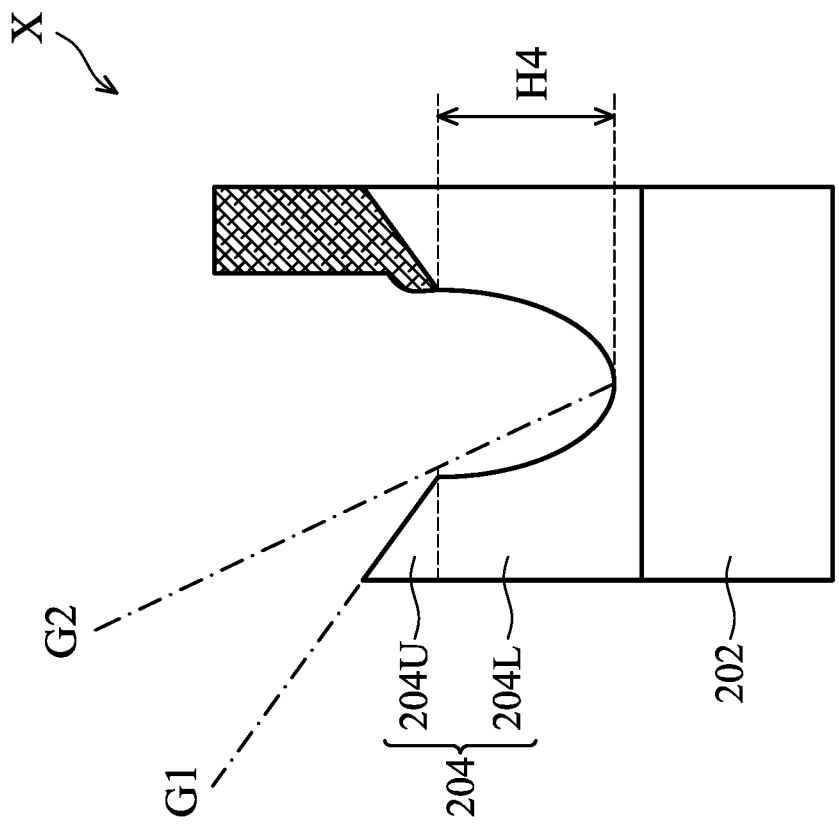
FIG. 10E is an enlarged view of the portion X in FIG. 10C.
Figure 11A:
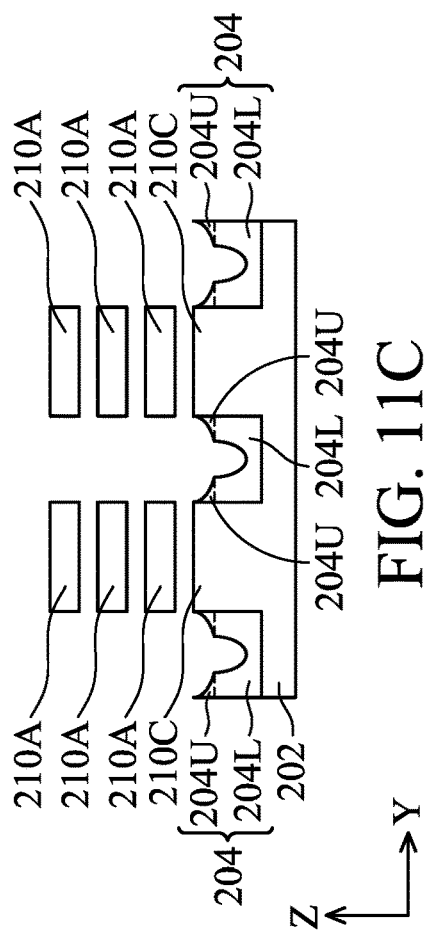
Figure 11C:
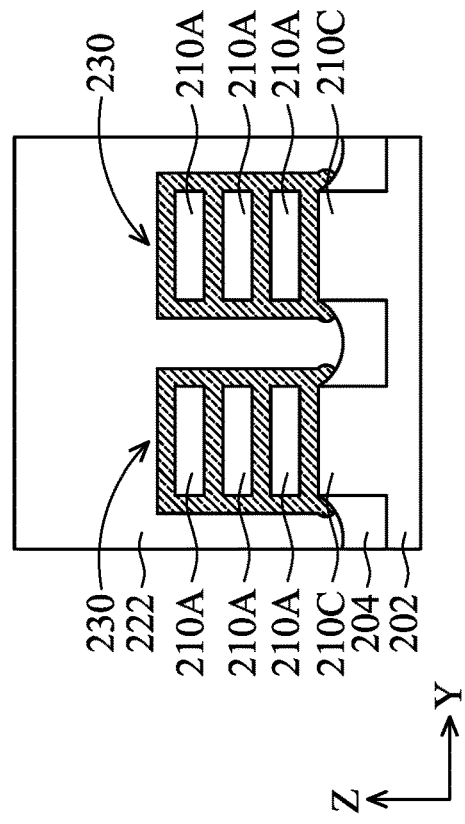
Figure 11B:
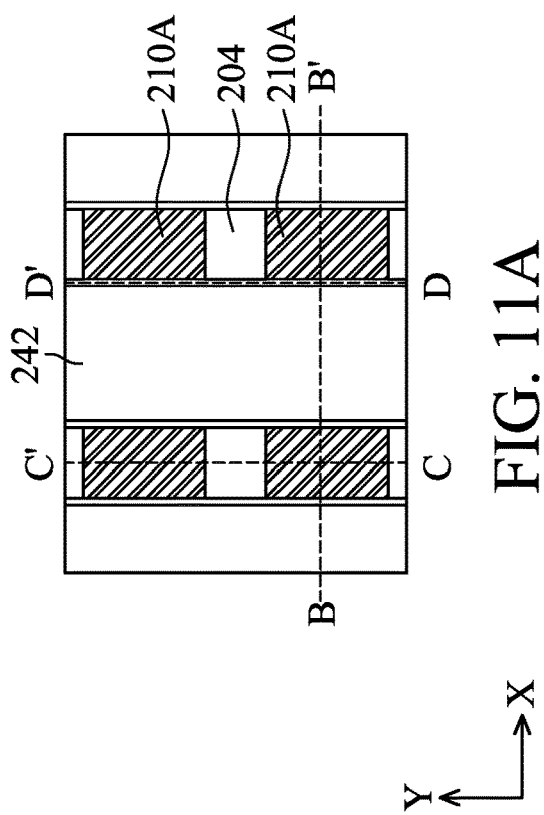
Figure 11D:
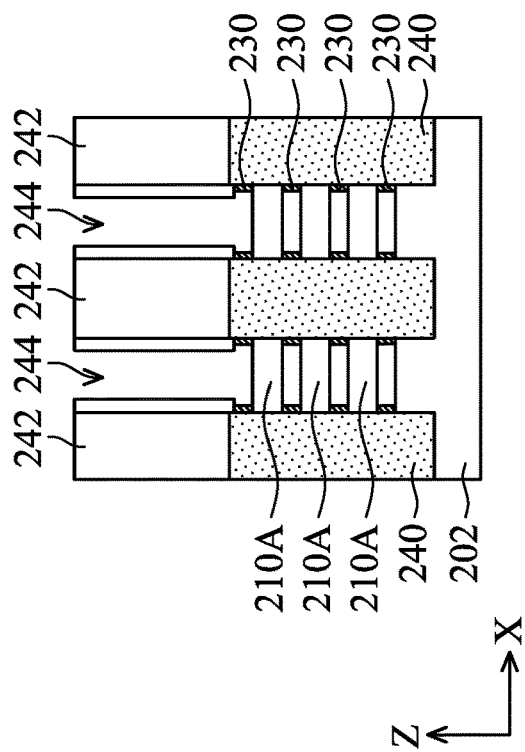
Figure 12A:
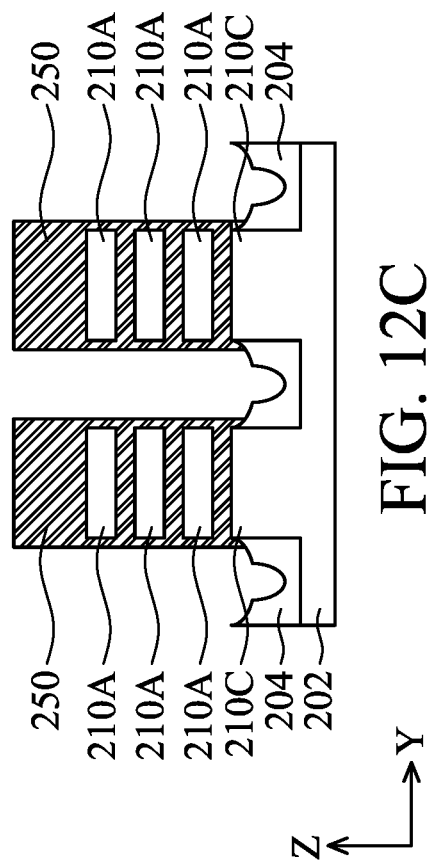
Figure 12B:
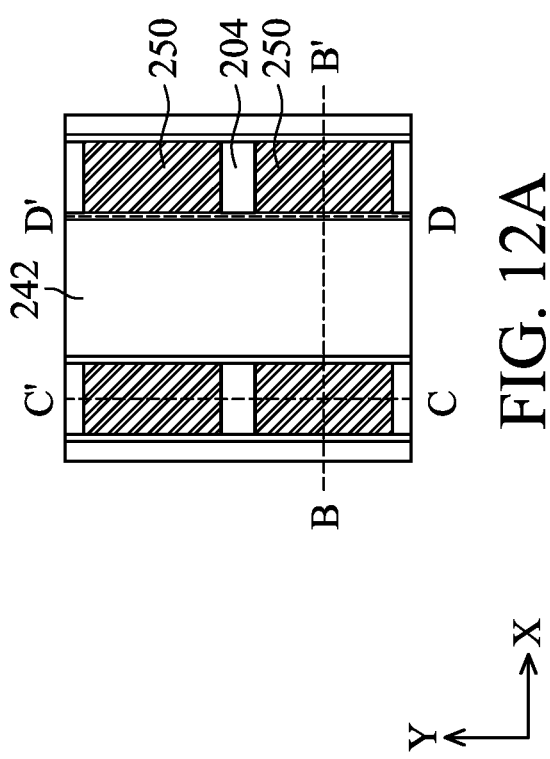
Figure 12C:
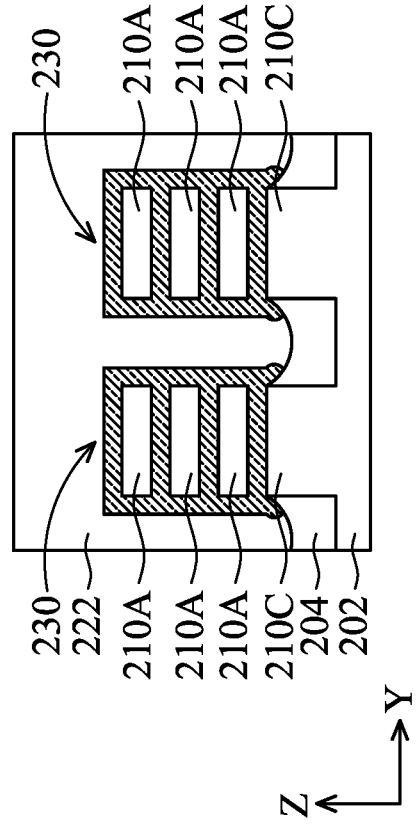
Figure 12D:
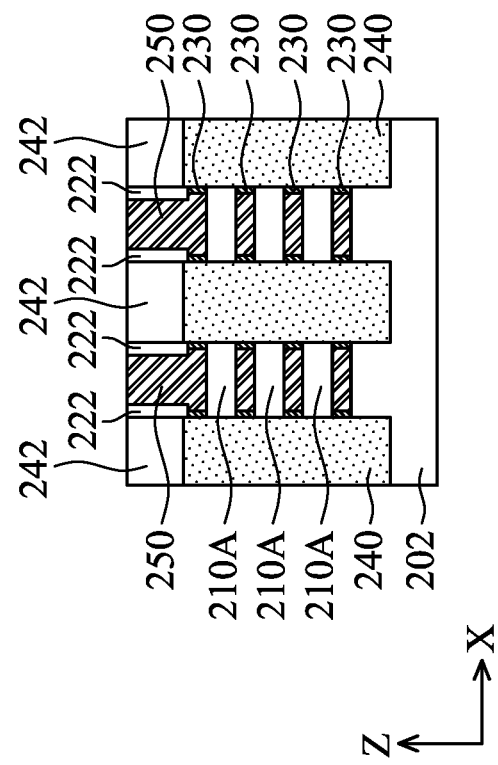
Figures 13A, 13B, 13C, 13D:
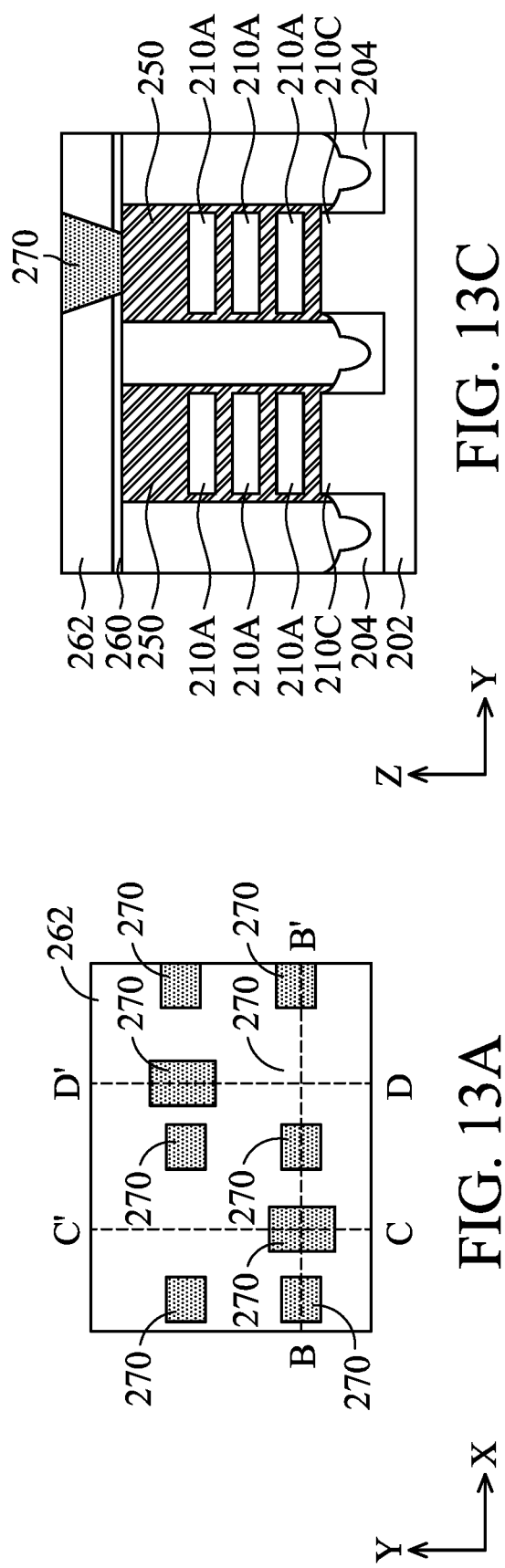

Now referring to FIGS. 1 and 10A-10D, at operation 116, the dummy gate structures 220 and the isolation layer 214 are removed to be prepared for a metal gate replacement process. FIG. 10E is an enlarged view of the portion X in FIG. 10C. Referring to FIGS. 10A and 10B, an interlayer dielectric (ILD) layer 242 is formed over the substrate 202. The ILD layer 242 is disposed along the gate spacers 222, over the epitaxial S/D features 240 and the isolation structure 204 in the S/D regions. In some embodiments, the ILD layer 242 comprises a low-k (K<3.9) dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 242 may be formed by deposition processes such as CVD, flowable CVD (FCVD), spin-on-glass (SOG), other suitable methods, or combinations thereof.

The dummy gate structures 220 and the isolation layer 214 are then removed to form gate trenches 244 (referring to FIG. 10B) exposing the channel regions of the stacks 210. In some embodiments, removing the dummy gate structures 220 and the isolation layer 214 comprises one or more etching processes, such as wet etching, dry etching, or other etching techniques. The capping layer 212 and the isolation structure 204 are then exposed in the gate trenches 244. Referring to FIG. 10C, the removal of the isolation layer 214 at operation 116 also removes portions of the isolation structure 204 (uncovered by the capping layer 212) between the stacks 210 in the channel region. And, referring to FIG. 10D, portions of the isolation structure 204 (covered by the gate spacer 222 and the inner spacers 230) in the S/D regions are substantially unchanged. Therefore, the portions of the isolation structure 204 in the channel region and the portions of the isolation structure 204 in the S/D region have different shapes. As depicted in FIG. 10E, the uncovered portion of the isolation structure 204 in the channel region can be recessed to a depth H4, for example, about 2 nm to about 10 nm, due to the etching process limitation. The isolation structure 204 in the channel region includes an upper portion 204U (covered by the capping layer 212) and a lower portion 204L (uncovered by the capping layer 212). Sidewalls of the upper portion 204U and the lower portion 204L are discontinuously connected. In other words, sidewalls of the upper portion 204U has a gradient G1, and sidewalls of the lower portion 204L has a gradient G2 greater than G1, referring to the X-Y plane. As depicted in FIG. 10D, the isolation structure 204 in the S/D region (covered by the gate spacer 222 and the inner spacers 230) has a continuous curved (recessed) top surface. In some embodiments, a portion of the capping layer 212 (for example, less than about 20%) may also be trimmed when removing the isolation layer 214.

Referring to FIGS. 1, 11A-11D and 12A-12D, at operation 118, a metal gate replacement process is performed. The metal gate replacement process includes various processed. Referring to FIGS. 11A-11D, the capping layer 212 and the semiconductor layers 210B are selectively removed from the gate trenches 244. Due to the different materials of the semiconductor layers 210A (for example, Si) and the semiconductor layers 210B or the capping layer 212 (for example, SiGe), the semiconductor layers 210B and the capping layer 212 are removed by a selective oxidation/etching process similar as those to remove the edge portions of the semiconductor layers 210B and the capping layer 212 during the inner spacer formation process. In some embodiments, the semiconductor layers 210A are slightly etched or not etched. Thereby, the semiconductor layers 210A are suspended in the channel regions and stacked up along the direction (Z-direction) substantially perpendicular to the top surface of the substrate 202 (X-Y plane). The suspended semiconductor layers 210A are also referred to as channel semiconductor layers 210A.

Then, referring to FIGS. 12A-12D, metal gate structures 250 are formed in the channel regions of the stacks 210. The metal gate structures 250 wrap each of the suspended semiconductor layers 210A. In some embodiments, each metal gate structure 250 may include a gate dielectric layer wrapping around each of the channel semiconductor layers 210A, a metal gate electrode over the gate dielectric layer, and other suitable layers. The gate dielectric layer includes a high-k (K>3.9) dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material, or combinations thereof. In some embodiments, the gate dielectric layer is deposited by CVD, PVD, ALD, and/or other suitable method. In some embodiments, each metal gate electrode includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the material of the WFM layer may include TiAl, TiAlC, TaAlC, TiAlN, TiN, TSN, TaN, WCN, Mo, other materials, or combinations thereof. The bulk metal may include Al, W, Cu, or combinations thereof. The various layers of the metal gate electrode may be formed by any suitable method, such as CVD, ALD, PVD, plating, chemical oxidation, thermal oxidation, other suitable methods, or combinations thereof. Thereafter, one or more polishing processes (for example, CMP) are applied to remove any excess conductive materials and planarize the top surface of the device 200.

In a conventional nanosheet device, the isolation structure around the bottom portion of the semiconductor stacks is trimmed to be very thin during the silicon capping layer removing process. Therefore, after the formation of the metal gate, the parasitic capacitance between the metal gate and the bottom portion of the semiconductor stack is high. However, in the present disclosure, due to the protection of the capping layer (having the same semiconductor material as the sacrificial semiconductor layers 210B), the isolation structure around the bottom portion of the semiconductor stack is thicker, thereby the parasitic capacitance between the metal gate and the bottom portion of the semiconductor stack can be reduced. Therefore, the performance of the nanosheet device can be improved.

Now referring to FIGS. 1, 13A-13D, at operation 120, further processing is performed to complete the fabrication of the device 200. For example, it may form various contacts/vias 270, metal lines (not shown), as well as other multilayer interconnect features, such as etch stop layer (ESL 260) and/or ILD layers 262 over the device 200, configured to connect the various features to form a functional circuit that comprises the different semiconductor devices.

Although not intended to be limiting, one or more embodiments of the present disclosure provide many benefits to a semiconductor device and a formation process thereof. For example, embodiments of the present disclosure provide a semiconductor device including corner isolation protection to enlarge the thickness of the isolation structure around the bottom portions of the semiconductor device. The thicker isolation structure can reduce the capacitance between the bottom portions of the metal gate and the semiconductor stack. The semiconductor device of the present disclosure also includes a uniform inner spacer around edge portions of each of the channel semiconductor layers of the semiconductor stack, which can provide more uniform gate to S/D capacitance and more uniform overlay resistance compare with the conventional structure. Therefore, the performance of the semiconductor device is improved.

The present disclosure provides for many different embodiments. Semiconductor device having corner isolation protection and methods of fabrication thereof are disclosed herein. An exemplary semiconductor device comprises a semiconductor stack including semiconductor layers over a substrate, wherein the semiconductor layers are separated from each other and are stacked up along a direction substantially perpendicular to a top surface of the substrate; an isolation structure around a bottom portion of the semiconductor stack and separating active regions; a metal gate structure over a channel region of the semiconductor stack and wrapping each of the semiconductor layers; a gate spacer over a source/drain (S/D) region of the semiconductor stack and along sidewalls of a top portion of the metal gate structure; and an inner spacer over the S/D region of the semiconductor stack and along sidewalls of lower portions of the metal gate structure and wrapping edge portions of each of the semiconductor layers.

In some embodiments, the isolation structure has a first shape in the channel region and a second shape in the S/D region, the second shape is different from the first shape. In some further embodiments, the first shape of the isolation structure in the channel region includes an upper portion and a lower portion, wherein a gradient of sidewalls of the upper portion is less than a gradient of sidewalls of the lower portion. In some further embodiments, the second shape of the isolation structure in the S/D region is a continuous recessing shape.

In some embodiments, a side portion of the inner spacer includes a bump contacting the isolation structure.

In some embodiments, the inner spacer covers a top surface of a topmost semiconductor layer and contacting a sidewall of each semiconductor layer in an edge portion. In some further embodiments, the inner spacer has a first thickness over the top surface of the top most semiconductor layer and a second thickness between the semiconductor layers, and the first thickness is about 50% to about 200% of the second thickness. In some further embodiments, the gate spacer is over the inner spacer and surrounds sidewalls of the inner spacer.

Another exemplary semiconductor device comprises semiconductor stacks over a substrate, wherein each semiconductor stack includes semiconductor layers separated from each other and stacked up along a direction substantially perpendicular to a top surface of the substrate; a metal gate structure over channel regions of the semiconductor stacks and wrapping each of the semiconductor layers; and an isolation structure separating bottom portions of the semiconductor stacks, wherein the isolation structure includes a first shape in the channel regions and a second shape in source/drain (S/D) regions, wherein the first shape is different from the second shape.

In some embodiments, the exemplary semiconductor device further comprises inner spacers wrapping edge portions of the semiconductor layers, wherein the inner spacers include horizontal portions wrapping top and bottom surfaces of the semiconductor layers and vertical portions along sidewalls of the semiconductor layers. In some embodiments, the exemplary semiconductor device further comprises a width of the vertical portions of the inner spacers is less than about 10% of a width of the isolation structure between the semiconductor stacks. In some embodiments, the vertical portions of the inner spacers include bumps contacting the isolation structure.

A method of forming a semiconductor device comprises alternately forming a semiconductor stack including first semiconductor layers and second semiconductor layers over a substrate, wherein the first semiconductor layers and the second semiconductor layers include different materials and are stacked up along a direction substantially perpendicular to a top surface of the substrate; forming an isolation structure around a bottom portion of the semiconductor stack; depositing a third semiconductor layer over the semiconductor stack and the isolation structure, wherein the third semiconductor layer includes a material same as the second semiconductor layers; forming a dummy gate structure over a channel region of the semiconductor stack; and forming a gate spacer along sidewalls of the dummy gate structure, wherein the gate spacer is over and surrounds the third semiconductor layer.

In some embodiments, the exemplary method further comprises forming a source/drain (S/D) trench in a S/D region of the semiconductor stack; removing edge portions of the second semiconductor layers and the third semiconductor layer from the S/D trench; and forming an inner spacer in the removed edge portions of the second semiconductor layers and the third semiconductor layer, wherein the inner spacer wrapping around the edge portions of each of the first semiconductor layers. In some embodiments, the exemplary method further comprises epitaxially growing a S/D feature in the S/D region, wherein the S/D feature contacting the inner spacer.

In some embodiments, the exemplary method further comprises removing the dummy gate structure; selectively removing the second semiconductor layers and the third semiconductor layer; and forming a metal gate structure wrapping each of the first semiconductor layers. In some embodiments, the exemplary method further comprises forming a dielectric isolation layer over the third semiconductor layer in the channel region before forming the dummy gate structure. In some embodiments, the exemplary method further comprises removing the dielectric isolation layer and a portion of the isolation structure in the channel region, such that the isolation structure in the channel region includes a first portion and a second portion, and a gradient of sidewalls of the first portion is less than a gradient of sidewalls of the second portion.

In some embodiments, the depositing the third semiconductor layer over the semiconductor stack and the isolation structure includes depositing the third semiconductor layer over the semiconductor stack with a higher speed than over the isolation structure. In some further embodiments, the third semiconductor layer includes a bump portion contacting the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a semiconductor stack including semiconductor layers over a substrate, wherein the semiconductor layers are separated from each other and are stacked up along a direction substantially perpendicular to a top surface of the substrate;

an isolation structure around a bottom portion of the semiconductor stack and separating active regions;

a metal gate structure over a channel region of the semiconductor stack and wrapping each of the semiconductor layers;

a gate spacer over a source/drain (S/D) region of the semiconductor stack and along sidewalls of a top portion of the metal gate structure; and an inner spacer over the S/D region of the semiconductor stack and along sidewalls of lower portions of the metal gate structure and wrapping edge portions of each of the semiconductor layers, wherein a side portion of the inner spacer includes a bump contacting the isolation structure.

2. The semiconductor device of claim 1, wherein the isolation structure has a first shape in the channel region and a second shape in the S/D region, the second shape is different from the first shape.

3. The semiconductor device of claim 2, wherein the first shape of the isolation structure in the channel region includes an upper portion and a lower portion, wherein a gradient of sidewalls of the upper portion is less than a gradient of sidewalls of the lower portion.

4. The semiconductor device of claim 2, wherein the second shape of the isolation structure in the S/D region is a continuous recessing shape.

5. The semiconductor device of claim 1, wherein the inner spacer covers a top surface of a topmost semiconductor layer and contacting a sidewall of each semiconductor layer in an edge portion.

6. The semiconductor device of claim 5, wherein the inner spacer has a first thickness over the top surface of the topmost semiconductor layer and a second thickness between the semiconductor layers, and the first thickness is about 50% to about 200% of the second thickness.

7. The semiconductor device of claim 5, wherein the gate spacer is over the inner spacer and surrounds sidewalls of the inner spacer.

8. The semiconductor device of claim 1, wherein the inner spacer completely wraps around edge portions of each of the semiconductor layers.

9. A semiconductor structure, comprising:
an active region comprising a bottom fin portion and a vertical stack of nanostructures disposed over the bottom fin portion;
an isolation structure around the bottom fin portion;
a gate structure comprising:
a bottom gate portion wrapping around each of the vertical stack of nanostructures, and
a top gate portion over the bottom gate portion;
an inner spacer wrapping around each of the vertical stack of the nanostructures; and
a gate spacer wrapping over the inner spacer and in contact with sidewalls of the inner spacer,
wherein a portion of the inner spacer is in direct contact with the isolation structure.

10. The semiconductor structure of claim 9,
wherein the active region comprises a channel region and a source/drain region,
wherein the gate structure is disposed over the channel region,
wherein the inner spacer is adjacent an interface between the channel region and the source/drain region.

11. The semiconductor structure of claim 10, further comprising:
a source/drain feature disposed over the source/drain region,
wherein the bottom gate portion is spaced apart from the source/drain feature by the inner spacer.

12. The semiconductor structure of claim 10,
wherein the isolation structure includes a first region adjacent the channel region and a second region adjacent the source/drain region,
wherein a shape of the first region is different from a shape of the second region.

13. The semiconductor structure of claim 10, further comprising:
an interlayer dielectric (ILD) layer over the isolation structure,
wherein the ILD layer adjacent the channel region extends further into the isolation structure than the gate spacer.

14. The semiconductor structure of claim 13, wherein a bottom portion of the ILD layer adjacent the channel region extends further into the isolation structure than a bottom portion of the ILD layer adjacent the source/drain region.

15. A semiconductor structure, comprising:
an active region comprising a bottom portion and a plurality of semiconductor layers stacked over the bottom portion;
an isolation structure around the bottom portion;
a gate structure comprising:
a bottom gate portion wrapping around each of the plurality of semiconductor layers, and
a top gate portion over the bottom gate portion;
an inner spacer wrapping around each of the plurality of semiconductor layers; and
a gate spacer wrapping over the inner spacer,
wherein the inner spacer and the gate spacer are in contact with the isolation structure.

16. The semiconductor structure of claim 15, wherein a portion of the inner spacer extends below a top surface of the bottom portion of the active region.

17. The semiconductor structure of claim 15, wherein the inner spacer comprises silicon oxide, silicon nitride, silicon oxynitride, silicon carbide, or a combination thereof.

18. The semiconductor structure of claim 15,
wherein the active region comprises a channel region and a source/drain region,
wherein the gate structure is disposed over the channel region,
wherein the inner spacer is adjacent an interface between the channel region and the source/drain region.

19. The semiconductor structure of claim 18, further comprising:
a source/drain feature disposed over the source/drain region,
wherein the bottom gate portion is spaced apart from the source/drain feature by the inner spacer.

20. The semiconductor structure of claim 18,
wherein the isolation structure includes a first region adjacent the channel region and a second region adjacent the source/drain region,
wherein a shape of the first region is different from a shape of the second region.

* * * * *